United States Patent [19]
Watanabe et al.

[11] Patent Number: 5,721,076
[45] Date of Patent: Feb. 24, 1998

[54] COLOR FILTERS AND MATERIALS AND RESINS THEREFOR

[75] Inventors: Kazuhiro Watanabe; Takero Teramoto; Kohki Inada, all of Kawasaki, Japan

[73] Assignees: Nippon Steel Corporation; Nippon Steel Chemical Co., Ltd., both of Tokyo, Japan

[21] Appl. No.: 360,709

[22] PCT Filed: Apr. 26, 1993

[86] PCT No.: PCT/JP93/00536

§ 371 Date: Feb. 27, 1993

§ 102(e) Date: Feb. 27, 1995

[87] PCT Pub. No.: WO94/00801

PCT Pub. Date: Jan. 6, 1994

[30] Foreign Application Priority Data

Jun. 19, 1992 [JP] Japan .................................. 4-184762
Dec. 7, 1992 [JP] Japan .................................. 4-351313

[51] Int. Cl.$^6$ .................. G03F 9/00; C08F 2/46; C08G 63/02
[52] U.S. Cl. .................. 430/7; 430/280; 430/286; 430/287; 430/906; 522/75; 522/81; 522/99; 522/100; 522/104; 522/108; 528/26; 528/272; 528/297
[58] Field of Search .................. 430/7, 280, 286, 430/287, 906; 522/81, 99, 100, 104, 108

[56] References Cited

U.S. PATENT DOCUMENTS

| | | | |
|---|---|---|---|
| 3,586,526 | 6/1971 | Aronoff et al. | 522/100 |
| 3,586,529 | 6/1971 | Aronoff et al. | 522/100 |
| 3,701,721 | 10/1972 | Lard | 430/287 |
| 4,640,887 | 2/1987 | Nakamura et al. | 430/286 |
| 5,196,296 | 3/1993 | Watanabe et al. | 522/100 |
| 5,268,257 | 12/1993 | Mirle et al. | 430/286 |

FOREIGN PATENT DOCUMENTS

| | | | |
|---|---|---|---|
| 1 166 880 | 5/1984 | Canada . | |
| 0030213 | 6/1981 | European Pat. Off. . | |
| 0182585 | 5/1986 | European Pat. Off. | 522/100 |
| 0421086 | 4/1991 | European Pat. Off. . | |
| 2894 | 1/1974 | Japan . | |
| 16789 | 2/1974 | Japan . | |
| 85051 | 5/1982 | Japan . | |
| 237441 | 11/1985 | Japan . | |
| 243869 | 10/1986 | Japan . | |
| 34151 | 2/1987 | Japan . | |
| 54774 | 3/1987 | Japan . | |
| 129303 | 6/1988 | Japan . | |
| 63-132916 | 6/1988 | Japan . | |
| 152449 | 6/1989 | Japan . | |
| 2-235917 | 9/1990 | Japan . | |
| 355450 | 12/1992 | Japan . | |
| 363311 | 12/1992 | Japan . | |

*Primary Examiner*—Glenn Caldarola
*Assistant Examiner*—J. Pasterczyk
*Attorney, Agent, or Firm*—Birch, Stewart, Kolasch & Birch, LLP

[57] ABSTRACT

This invention relates to alkali-developable photosensitive or thermosetting resin compositions obtained by mixing (A) polymerizable unsaturated compounds having main structural units represented by the following general formulas (1) and (2)

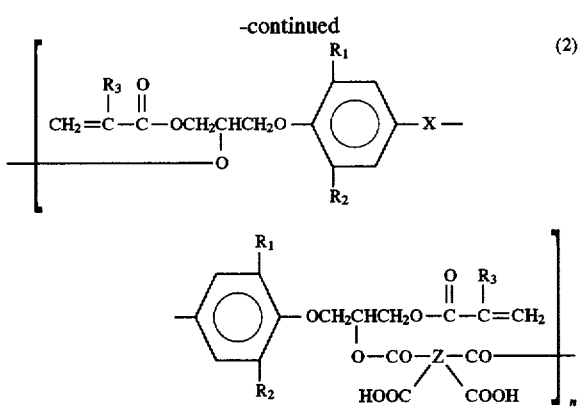

[wherein $R_1$, and $R_2$ designate hydrogen, alkyl group with 1 to 5 carbon atoms or halogen, $R_3$ designates hydrogen or methyl group, X designates —CO—, —SO$_2$—, —C(CF$_3$)$_2$—, —Si(CH$_3$)$_2$—, —CH$_2$—, —C(CH$_3$)$_2$—, —O—,

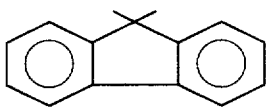

or direct linkage, Y designate acid anhydride residue, Z designates acid dianhydride residue and the mole ratio of the structural units (m/n) is from 1/99 to 90/10 and showing an inherent viscosity ($\eta_{inh}$) of 0.1 dl/g or more as determined on a solution of 0.5 g of said compounds in 100 ml of N-methylpyrrolidone at 30° C., (B) a compound having epoxy group, (C) a photopolymerization initiator, a sensitizer or a radical polymerization initiator and (D) a pigment in a specified ratio and to materials containing said resin compositions for color filter use.

20 Claims, 3 Drawing Sheets

COLOR FILTERS AND MATERIALS AND RESINS THEREFOR

FIELD OF TECHNOLOGY

This invention relates to alkali-developable photosensitive or thermosetting materials for color filter use and to color filters prepared therefrom and also relates to alkali-developable photosensitive or thermosetting resin compositions useful for the preparation of said materials for color filter use and to photochemically or thermally polymerizable unsaturated compounds useful for said resin compositions.

The materials for color filter use can be utilized as inks in the preparation of color filters for a variety of multicolor displays and optical instruments such as color liquid crystal display devices, color facsimile and image sensors. Moreover, color filters prepared from said materials can be utilized as filters for displays such as television, video monitors and computers. In addition to the aforementioned inks for color filters, the resin compositions can be used for protective films on color filters and for solder resists in the preparation of printed circuit boards. The polymerizable unsaturated compounds are used in the preparation of said resin compositions.

BACKGROUND TECHNOLOGY

A conventional color liquid crystal display device constructed of liquid crystals and a color filter as controller of the transmission or reflection of light, the color filter in question is prepared by forming red, green and blue pixels and a black matrix on a glass substrate by dyeing or printing. A color filter prepared by the dyeing process is mainly used where images of a particularly high degree of fineness are required.

According to the dyeing process, a color filter is prepared by forming a black matrix on a glass substrate, applying a photosensitive solution which is prepared by sensitizing natural photosensitive resins such as gelatins or synthetic photosensitive resins such as amine-modified poly(vinyl alcohol) with dichromic acid, exposing through a photomask and developing for patterning or utilizing a masking coat and dyeing with an acid dye and the like. With the dyeing process, however, it is necessary to apply a dye-resisting treatment to those regions which require no coloring in order to prevent the color in the first dyeing from mixing with that in the second dyeing. This treatment complicates the manufacturing process. Moreover, coating films present problems in the reliability of such properties as light resistance, heat resistance and moisture resistance [Japan Kokai Tokkyo Koho No. Hei 1-52,738 (1989)].

On the other hand, the printing process uses inks prepared by dispersing pigments in thermosetting resins or ultraviolet-curable resins. In this case, tricolor filter patterns must be aligned precisely during printing. This alignment is difficult to perform and causes problems in fine patterning and surface smoothness [Japan Kokai Tokkyo Koho Nos. Sho 62-54,774 (1987) and Sho 63-129,303 (1988)].

Dispersions of pigments in photosensitive benzyl methacrylate-methacrylic acid copolymers are disclosed in Japan Kokai Tokkyo KohoNo. Hei 1-152,449 (1989). With the use of this type of photosensitive coatings, the films in the exposed region directly constitute a color filter. The photosensitive coatings in question, however, cure insufficiently in the presence of oxygen, which results in lower resolution and sensitivity. It therefore becomes necessary to provide a complicated step for forming an oxygen-barrier film before exposure and stripping it off before development and there is a problem of heat resistance and developing characteristics of the films thus obtained.

As described above, color filters prepared by the conventional printing, dyeing or pigment dispersion process have shortcomings such as low resolution and complicated manufacturing steps.

Screen printing is used extensively for the formation of protective films on color filters and resist patterns on printed circuit boards. This process, however, frequently causes such phenomena as bleeding, smearing or sagging in practice and can no longer cope with recent trend for higher density of devices in printed circuit boards.

Dry-film photoresists and liquid developable resist inks have been proposed to solve these problems. Dry-film photoresists, however, tend to generate bubbles during thermal pressing, exhibit uncertainty over heat resistance and adhesion characteristics and command a high price.

On the other hand, liquid resists retain tack after precure and soil the mask and, for this reason, they are not applicable to close-contact exposure which is advantageous to higher resolution and tapering. The liquid resists on the market today use organic solvents as developer solution and these solvents are air pollution hazards and, besides, expensive. For example, Japan Tokkyo Kokai Koho No. Sho 61-243, 869 (1986) discloses photosensitive resin compositions which are mainly composed of phenolic novolak resins and can be developed by a weakly alkaline aqueous solution. The compositions, however, could not sufficiently withstand high temperature and acidic and alkaline conditions and suffered deterioration of adhesion characteristics to the substrates after processing.

Japan Tokkyo Kokai Koho Nos. Hei 4-355,450 (1992) and Hei 4-363,311 (1992) disclose resin compositions which are mainly composed of unsaturated group-containing carboxylic acids obtained by the reaction of specified epoxy compounds with (meth)acrylic acid followed by the further reaction with polybasic carboxylic acids or their anhydrides and which are useful as materials for solder resists or materials for color filters and also disclose cured products of said resin compositions. However, even these compositions retain tack after precure and are not applicable to close-contact exposure.

The present inventors have conducted extensive studies to solve the aforementioned problems, synthesized novel polymerizable unsaturated compounds having carboxyl groups and photochemically or thermally polymerizable unsaturated linkages, found that the use of materials for color filter formulated from said polymerizable unsaturated compounds, epoxy compounds, photopolymerization initiators or sensitizers or radical polymerization initiators and, as needed, pigments in a specified ratio can solve the above-mentioned problems relating to color filters and solder resists and completed this invention.

Accordingly, it is an object of this invention to provide an alkali-developable photosensitive or thermosetting material for color filter use which enables the preparation of a color filter without the use of oxygen-barrier films, shows high resolution and excellent heat resistance (250° C. or above), transparency, adhesion characteristics, hardness, solvent resistance and alkali resistance after irradiation with light and can be developed with a weakly alkaline aqueous solution.

Another object of this invention is to provide a color filter which can be prepared from said material for color filter use.

A further object of this invention is to provide a material for color filter use which is suitable for the preparation of a color filter particularly useful for displays such as television, video monitors or computers and to provide a color filter prepared from said material.

A still further object of this invention is to provide a resin composition which forms a tack-free film after precure, can be applied to close-contact exposure and shows excellent heat resistance, transparency, adhesion characteristics, hardness, solvent resistance and alkali resistance and to provide a cured product obtained from said resin composition.

Another object of this invention is to provide a resin composition which is particularly suitable for protective films on color filters or for solder resists in the preparation of printed circuit boards and to provide a cured product obtained from said resin composition.

A further object of this invention is to provide novel photochemically and thermally polymerizable unsaturated compounds which are useful for the preparation of the aforementioned material for color filter use, resin composition and its cured product.

DISCLOSURE OF THE INVENTION

This invention thus relates to a material for color filter use which comprises (A) 100 parts by weight of photochemically and thermally polymerizable unsaturated compounds (hereinafter referred to as component A) having main structural units represented by the following general formulas (1) and (2)

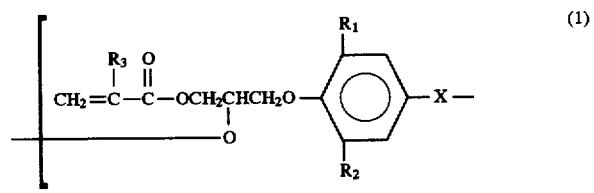

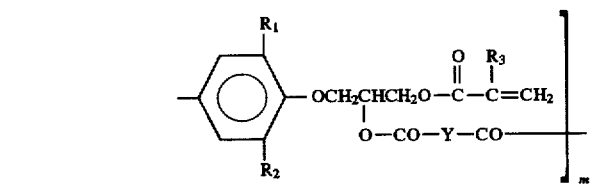

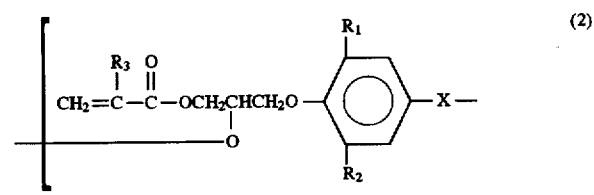

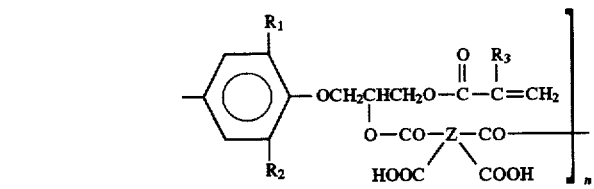

[wherein $R_1$, and $R_2$ designate hydrogens, alkyl groups with 1 to 5 carbon atoms or halogens, $R_3$ designates hydrogens or methyl groups, X designates —CO—, —SO$_2$—, —C(CF$_3$)$_2$—, —Si(CH$_3$)$_2$—, —CH$_2$—, —C(CH$_3$)$_2$—, —O—.

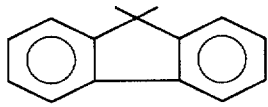

or a direct linkage, Y designates a divalent organic group of an acid anhydride residue, Z a tetravalent organic group of an designates acid dianhydride residue and the mole ratio of the structural units (m/n) is 0/100 to 100/0] and showing an inherent viscosity ($\eta_{inh}$) of 0.1 dl/g or more as determined on a solution of 0.5 g of said compounds in 100 ml of N-methylpyrrolidone at 30° C., (B) 5 to 50 parts by weight of a compound having an epoxy group (hereinafter referred to as component B), (C) 0.1 to 30 parts by weight of a photopolymerization initiator, a sensitizer or a radical polymerization initiator (hereinafter referred to as component C) and (D) 0 to 200 parts by weight of a pigment (hereinafter referred to as component D).

This invention also relates to a color filter which comprises a transparent substrate, red, blue and green pixels and a black matrix provided on the substrate by coating the substrate with said material for color filter use and curing and a layer of transparent electrode on the surface of said pixels and black matrix.

This invention further relates to a resin composition which comprises 100 parts by weight of the aforementioned component A, 5 to 50 parts by weight of the component B, 0.1 to 30 parts by weight of the component C and 0 to 200 parts by weight of the component D and to a product obtained by curing said resin composition.

This invention still further relates to polymerizable unsaturated compounds having main structural units represented by the aforementioned general formulas (1) and (2) which are used in the aforementioned material for color filter use and in a color filter prepared from said material and in the preparation of a resin composition and its cured product useful for the aforementioned material for color filter and solder resist.

Of the photochemically and thermally polymerizable unsaturated compounds having the main structural units of the general formulas (1) and (2), those particularly useful for this invention are the ones having the main structural unit represented by the following general formula (3)

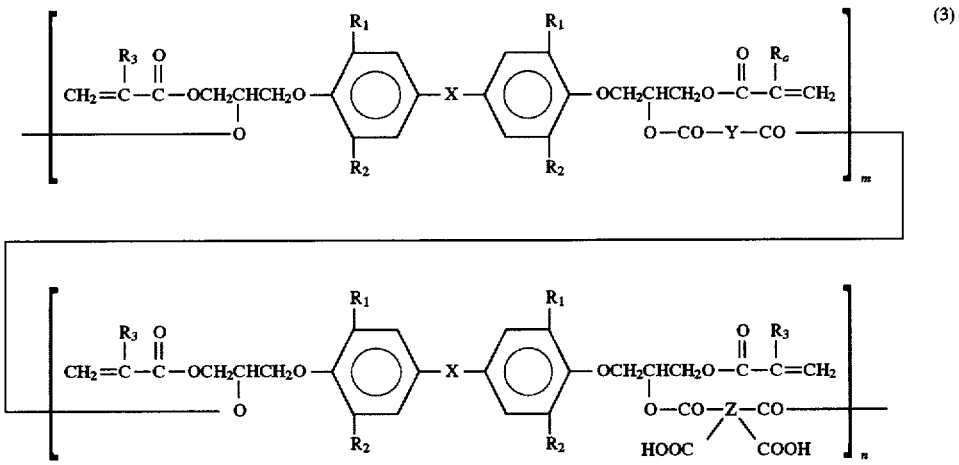

[wherein $R_1$, $R_2$, X, Y and Z are the same as above and the mole ratio of the structural units (m/n) is 1/99 to 90/10]. Here, the term "main" refers to a proportion of 50% by weight or more, preferably 70% by weight or more.

This invention will be described in detail below.

In the structural units represented by the general formulas (1) and (2) in the aforementioned polymerizable unsaturated compounds (component A) of this invention, concrete examples of the bisphenol components include bis(4-hydroxyphenyl) ketone, bis(4-hydroxy-3,5-dimethylphenyl) ketone and bis(4-hydroxy-3,5-dichlorophenyl) ketone where X is —CO—; bis(4-hydroxyphenyl) sulfone, bis(4-hydroxy-3,5-dimethylphenyl) sulfone and bis(4-hydroxy-3,5-dichlorophenyl) sulfone where X is —$SO_2$—; bis(4-hydroxyphenyl)hexafluoropropane, bis(4-hydroxy-3,5-dimethylphenyl)hexafluoropropane and bis(4-hydroxy-3,5-dichlorophenyl)hexafluoropropane where X is —$C(CF_3)_2$—; bis(4-hydroxyphenyl)dimethylsilane, bis(4-hydroxy-3,5-dimethylphenyl) dimethylsilane and bis(4-hydroxy-3,5-dichlorophenyl)dimethylsilane where X is —Si$(CH_3)_2$—; bis(4-hydroxyphenyl)methane, bis(4-hydroxy-3,5-dichlorophenyl)methane and bis(4-hydroxy-3,5-dibromophenyl)methane where X is —$CH_2$—; 2,2-bis(4-hydroxyphenyl)propane, 2,2-bis(4-hydroxy-3,5-dimethylphenyl)propane, 2,2-bis(4-hydroxy-3,5-dichlorophenyl) propane, 2,2-bis(4-hydroxy-3-methylphenyl)propane and 2,2-bis(4-hydroxy-3-chlorophenyl) propane where X is —$C(CH_2)_2$—; bis(4-hydroxyphenyl) ether, bis(4-hydroxy-3,5-dimethylphenyl) ether and bis(4-hydroxy-3,5-dichlorophenyl) ether where X is —O—; 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene and 9,9-bis(4-hydroxy-3,5-dibromophenyl)fluorene where X is;

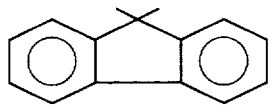

and 4,4'-biphenol and 3,3'-biphenol where X is direct linkage.

In the aforementioned general formulas (1) and (2), Y designates a divalent organic group of the residue of an acid anhydride and Z that of a tetravalent organic group of an acid dianhydride. Acid anhydrides capable of introducing the Y group are, for example, maleic anhydride, succinic anhydride, itaconic anhydride, phthalic anhydride, tetrahydrophthalic anhydride, hexahydrophthalic anhydride, methylendomethylenetetrahydrophthalic anhydride, chlorendic anhydride and methyltetrahydrophthalic anhydride. Acid dianhydrides capable of introducing the Z group are, for example, aromatic polycarboxylic acid anhydrides such as pyromellitic dianhydride, benzophenonetetracarboxylic acid dianhydride, biphenyltetracarboxylic acid dianhydride, and biphenylethertetracarboxylic acid dianhydride. The groups $R_1$ and $R_2$ are any of hydrogen, alkyl groups with 1 to 5 carbon atoms or halogen, the group $R_3$ is hydrogen or methyl group, and $R_1$, $R_2$ and $R_3$ are preferably hydrogen.

The component A having the structural units represented by the aforementioned general formulas (1) and (2) is not necessarily limited to the examples described above and these compounds may be used singly or as a mixture of two or more.

The polymerizable unsaturated compounds of the component A can be prepared as follows. For example, a bisphenolfluorene-based epoxy compound of the following general formula (4) synthesized from a bisphenolfluorene is treated with (meth)acrylic acid of the following general formula (5) to yield a bisphenolfluorene-based epoxy acrylate of the general formula (6), which is heated with the aforementioned acid anhydride in a cellosolve-based solvent such as ethyl cellosolve and butyl cellosolve acetate to give the intended polymerizable unsaturated compounds. The reaction temperature is desirably set so that ½ mole of the acid anhydride reacts quantitatively with 1 mole of the OH group in the epoxy acrylate or at 100° to 130° C., preferably at 115° to 125° C. This holds true for all the polymerizable unsaturated compounds having the structural units of the general formulas (1) and (2).

General formula (4)

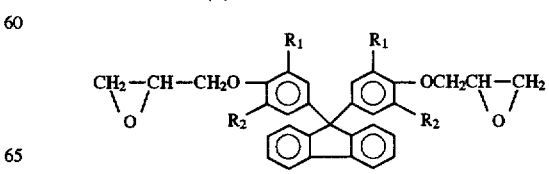

General formula (5)

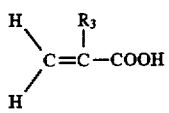

General formula (6)

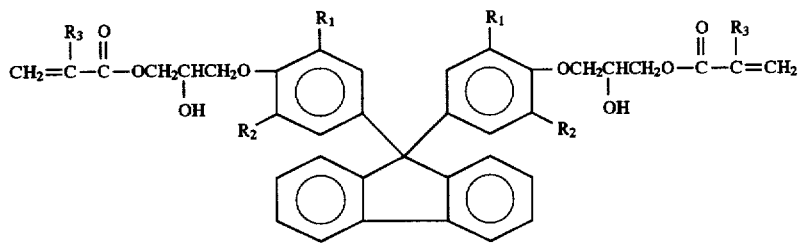

[In the general formulas (4), (5) and (6), $R_1$, $R_2$ and $R_3$ are defined as in the above-mentioned general formulas (1), (2) and (3)].

Although Y refers to the residue of an acid anhydride and Z to that a tetravalent organic group of an acid dianhydride in the general formulas (1) and (2), it is desirable to subject a mixture of an acid anhydride and an acid dianhydride to the reaction with a bisphenolfluorene-based epoxy acrylate of the aforementioned general formula (6) in actual synthesis. The ratio of acid anhydride to acid dianhydride can be chosen at will and the mol ratio (m/n) of acid anhydride (m) to acid dianhydride (n) is 0/100 to 100/0, preferably 1/99–90/10, more preferably 5/95 to 80/20. Where m is 1 mol % or more, the quantity of total carboxyl groups (—COOH) does not become too excessive whereby the alkali resistance is maintained, the exposed region does not dissolve into an aqueous alkaline developer solution and the intended patterning is advantageously obtained. Where m is less than 90%, the alkaline developing characteristics are not affected adversely and patterning becomes easier.

Of the photochemically and thermally polymerizable unsaturated compounds having the main structural units of the general formulas (1) and (2), those particularly desirable are the ones having the main structural unit represented by the following general formula (3)

[wherein $R_1$, $R_2$, X, Y and Z are the same as above and the mole ratio of the structural units (m/n) is 1/99 to 90/10]. The presence of this structural unit solves the problem of tack after precure and assures the application of close-contact exposure. Moreover, the cured film after postcure develops excellent heat resistance and enables sputtering of ITO at as high a temperature as 250° C.

The molecular weight of the polymerizable unsaturated compounds in terms of inherent viscosity ($\eta_{inh}$) is 0.1 dl/g or more, preferably 0.15 dl/g or more, as determined on a solution of 0.5 g of the compounds in 100 ml of N-methylpyrrolidone at 30° C. A molecular weight of less than 0.1 dl/g is too low and tack remains after precure (drying of coating film), which makes it impossible to apply close-contact exposure and causes soiling of the mask.

The compounds containing epoxy group (component B) are, for example, epoxy resins such as phenol novolak epoxy resins, cresol novolak epoxy resins, bisphenol A-based epoxy resins, bisphenol F-based epoxy resins, bisphenol S-based epoxy resins, biphenyl-based epoxy resins, bisphenolfluorene-based epoxy resins and alicyclic epoxy resins and compounds containing at least one epoxy group such as phenyl glycidyl ether, p-butylphenol glycidyl ether, triglycidyl isocyanurate, diglycidyl isocyanurate, allyl glycidyl ether and glycidyl methacrylate.

A photopolymerization initiator, a sensitizer or a radical polymerization initiator (component C) to be used in this invention is intended not only for the component A but also for polymerizable (meth) acrylic monomers and (meth) acrylic oligomers which are added as needed.

Examples of such photopolymerization initiator are acetophenone and its derivatives such as 2,2-diethoxyacetophenone, p-dimethylacetophenon e, p-dimethylaminopropiophenone, dichloroacetophenone,

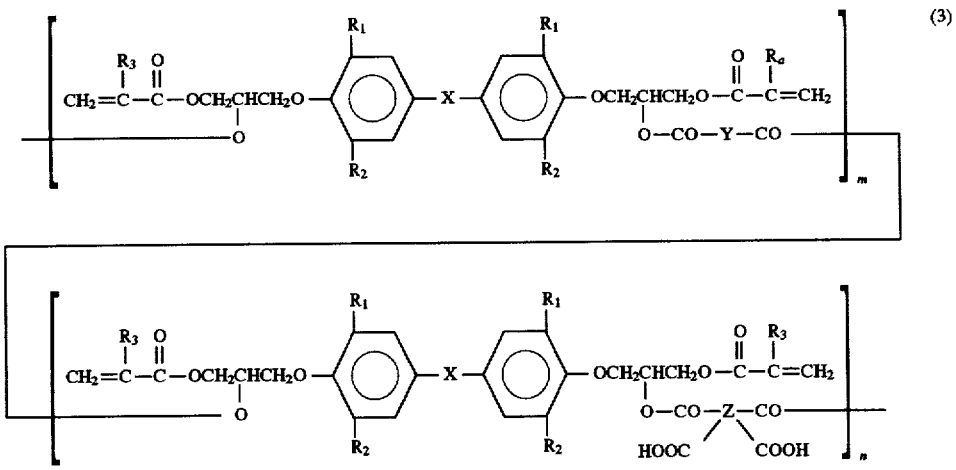

trichloroacetophenone and p-tert-butylacetophenone, benzophenone and its derivatives such as 2-chlorobenzophenone and p,p'-bisdimethylaminobenzo phenone, benzil, benzoin and their derivatives such as benzoin methyl ether, benzoin isopropyl ether, benzoin isobutyl ether and benzil dimethyl ketal, sulfur compounds such as thioxanthone, 2-chlorothioxanthone, 2,4-diethylthioxanthone, 2-methylthioxanthone, and 2-isopropylthioxanthone, anthraquinone derivatives such as 2-ethylanthraquinone, octamethylanthraquinone, 1,2-benzanthraquinone and 2,3-diphenylanthraquinone, azobisisobutyronitrile, organic peroxides such as benzoyl peroxide and cumene peroxide and thiols such as 2-mercaptobenzimidazole, 2-mercaptobenzoxazole and 2-mercaptobenzothiazol e. These compounds can be used singly or as a mixture of two or more.

A sensitizer does not act as a photopolymerization initiator by itself and it is normally used in combination with the aforementioned photopolymerization initiators to enhance the capability of the initiators. In this invention, a sensitizer may be used not only together with the aforementioned photopolymerization initiator but also singly. Examples of such sensitizer are tertiary amines such as triethanolamine which are effective when used in combination with benzophenone.

Known peroxide initiators and azobis type initiators may be used as radical polymerization initiator in this invention. Examples of peroxide initiators are ketone peroxides such as methyl ethyl ketone peroxide, methyl isobutyl ketone peroxide, cyclohexanone peroxide, methylcyclohexanone peroxide, and acetylacetone peroxide; diacyl peroxides such as isobutyryl peroxide, 2,4-dichlorobenzoyl peroxide, o-methylbenzoyl peroxide and bis-3,5,5-trimethylhexanoyl peroxide; hydroperoxides such as 2,4,4-trimethylpentyl 2-hydroperoxide, diisopropylbenzene hydroperoxide, cumene hydroperoxide and t-butyl hydroperoxide; dialkyl peroxides such as dicumyl peroxide, 2,5-dimethyl-2,5-di(t-butylperoxy)hexane, 1,3-bis(t-butyloxyisopropyl)benzene and t-butyl cumyl peroxide; peroxyketals such as 1,1-di-t-butylperoxy-3,3,5-trimethylcyclohexane, 2,2-di-(t-butylperoxy)butane, 4,4-di-t-butylperoxyvaleric acid n-butyl ester; alkyl peresters such as 2,4,4-trimethylpentylperoxy phenoxyacetate, α-cumylperoxy neodecanoate, t-butylperoxy benzoate and di-t-butylperoxy trimethyladipate; percarbonates such as di-3-methoxybutyl peroxydicarbonate, di-2-ethylhexyl peroxydicarbonate, bis (4-t-butylcyclohexyl) peroxydicarbonate and diisopropylperoxydicarbonate; and acetylcyclohexylsulfonyl peroxide and t-butylperoxy allyl carbonate. Examples of azobis type initiators are 1,1'-azobiscyclohexane-1-carbonitrile, 2,2'-azobis(2,4-dimethylvaleronitrile), 2,2-azobis(methyl isobutyrate), 2,2'-azobis (4-methoxy-2,4-dimethylvaleronitrile), α,α'-azobis(isobutylnitrile) and 4,4'-azobis(4-cyanovaleric acid).

These radical polymerization initiators may be used singly or as a mixture of two or more or they can be used together with the aforementioned photopolymerization initiators and sensitizers.

A material for color filter use of this invention may be satisfactorily composed of the aforementioned components A, B and C where it is intended for protective films on color filters. However, pigments (component D) are added to the aforementioned components A, B and C for coloring the coating film where the material is intended for inks for color filter use. The pigments to be used here include organic pigments and inorganic pigments. Examples of the organic pigments are azo lakes, insoluble azo pigments, phthalocyanines, quinacridones, dioxazines, isoindolinones, perinones, anthraquinones, perylenes and their mixtures. Examples of the inorganic pigments are Miroli blue, iron oxide, cobalt-based pigments, manganese-based pigments, ultramarine, Prussian blue, cobalt blue, cerulean blue, viridian, emerald green, cobalt green and their mixtures. In order for these pigments to color the coating film while maintaining the transparency of the film, it is desirable to disperse the pigments to a particle diameter of 0.4 µm or less which is the lower limit for the wavelength of visible light. In practical use, it is desirable for the pigment to have an average particle diameter of 0.2 to 0.3 µm.

A material for color filter use of this invention comprises the aforementioned components A, B, C and D and the proportion of each component is 100 parts by weight of the component A, 5 to 50 parts by weight, preferably 10 to 30 parts by weight, of the component B, 0.1 to 30 parts by weight, preferably 1 to 20 parts by weight, of the component C and 0 to 200 parts by weight of the component D. The proportion of the component D is 10 to 200 parts by weight in the case of inks for color filter use. If the proportion of the component B is less than 5 parts by weight per 100 parts by weight of the component A, the resin components in the inks of this invention develop insufficient properties after curing, insufficient alkali resistance in particular. On the other hand, if this proportion exceeds 50 parts by weight, cracking occurs during curing and the adhesion characteristics tend to deteriorate. If the proportion of the component C is less than 0.1 part by weight to 100 parts by weight of the component A, the rate of polymerization drops with a resultant drop in sensitivity. On the other hand, if the proportion exceeds 30 parts by weight, it becomes difficult for light to reach the substrate and the adhesion between substrate and resin becomes poorer. Moreover, in the case of inks for color filter use, addition to the inks of less than 10 parts by weight of the component D per 100 parts of the component cannot yield the desired spectral characteristics while addition in excess of 200 parts by weight undesirably lowers the adhesion characteristics of coating film.

Depending upon the properties required for intended usages, it is allowable to add, besides the aforementioned component A, photochemically and/or thermally polymerizable monomers and oiligomers which act as viscosity modifier or photocrosslinking agent to the material for color filter use within a specified range.

The polymerizable monomers and oligomers here include hydroxyl group-containing monomers such as 2-hydroxyethyl (meth)acrylate and 2-hydroxypropyl (meth) acrylate and (meth)acrylate esters such as 2-ethylhexyl (meth)acrylate, ethylene glycol di(meth)acrylate, diethylene glycol di(meth)acrylate, triethylene glycol di(meth)acrylate, tetraethylene glycol di(meth)acrylate, tetramethylene glycol di(meth) acrylate, trimethylolpropane tri(meth)acrylate, trimethylolethane tri(meth)acrylate, pentaerythritol di(meth) acrylate, pentaerythritol tri(meth)acrylate, pentaerythritol tetra(meth)acrylate, dipentaerythritol tetra(meth)acrylate, dipentaerythritol hexa(meth) acrylate and glycerol (meth) acrylate. These compounds may be used singly or as a mixture of two or more.

The amount of these polymerizable monomers and oligomers must be so as not to affect adversely the properties of a material for color filter use of this invention and it is normally 50 parts by weight or less per 100 parts of the polymerizable unsaturated compounds of the general formulas (1) and (2). The use of more than 50 parts by weight causes a problem in tack after precure.

It is possible to incorporate into a material for color filter use of this invention additives such as accelerators for epoxy groups, thermal polymerization inhibitors, plasticizers, leveling agents and antifoaming agents as needed. Examples of the curing accelerators for epoxy groups are amines, imidazoles, carboxylic acids, phenols, quaternary ammonium salts and methylol group-containing compounds. Heating a coating film with simultaneous use of these compounds in small amounts improves the properties of the resulting resist film such as resistance to heat, solvent, acid and metal plating, adhesion characteristics, electrical characteristics and hardness. Examples of the thermal polymerization inhibitors are hydroquinone, hydroquinone monomethyl ether, pyrogallol, tert-butylcatechol and phenothiazine. The plasticizers are exemplified by dibutyl phthalate, dioctyl phthalate and tricresyl phosphate and the defoaming agents and leveling agents by silicones, fluorine-containing compounds and acrylic compounds.

A material for color filter use of this invention can be used advantageously for color filters for color liquid crystal displays and the like. Provision of protective films on such color filters by coating makes it possible to sputter ITO at as high a temperature as 250° C., hitherto limited to 200° C. because of poorer heat resistance of the conventional color filters.

In the cases where a material for color filter use is an alkali-developable photosensitive or thermosetting ink for color filter use, a developer solution suitable for alkaline development of this ink is, for example, an aqueous solution of an alkali metal carbonate or alkaline earth metal carbonate or an aqueous solution of an alkali metal hydroxide. In particular, a weakly alkaline aqueous solution containing 0.1 to 3% by weight of sodium carbonate, potassium carbonate or lithium carbonate can develop fine images with precision. Alkaline development of an ink of this invention can be carried out with the aid of a commercial developing apparatus or an ultrasonic cleaner normally at 10° to 50° C., preferably at 20° to 40° C.

An ink of this invention for color filter use cures by light or heat. Light suitable for this curing is the one discharged from an ultrahigh-pressure mercury lamp, a high-pressure mercury lamp or a metal halide lamp while heating for this curing is conducted normally at 80° to 250° C., preferably at 120° to 220° C., with the use of a heating oven.

An ink for color filter use such as above can be used in a variety of multicolor displays such as color liquid crystal displays, color facsimile and image sensors in addition to the aforementioned color filters for color liquid crystal displays. In such a case, the ink is applied to the surface of a substrate to form a film and, where it is photosensitive, a negative is placed on the film thus formed, the assembly is irradiated with an active ray of light to cure the exposed region and the unexposed region is dissolved off by a weakly alkaline aqueous solution. Where the ink is thermosetting, a pattern is drawn by a screen printer and the like and cured by heating.

After the alkaline development, it is desirable to apply heat to effect epoxy curing in order to improve the alkali resistance. An ink of this invention improves not only in durability to strongly alkaline solutions to a remarkable degree but also in a variety of properties required for solder resists such as adhesion characteristics to glass and copper, heat resistance and surface hardness as a result of the heat treatment. The curing treatment is carried out, for example, at 80° to 200° C. for 10 to 120 minutes.

An ink for color filter use of this invention is applied as a solution or dispersion in a suitable solvent, for example, a ketone such as methyl ethyl ketone and methyl isobutyl ketone and a cellosolve such as methyl cellosolve, ethyl cellosolve, butyl cellosolve and cellosolve acetate.

A process such as dipping, spraying, roll coating and spin coating may be adopted for the application of this ink for color filter use to a substrate.

The preparation of an ink for color filter use of this invention and of a color filter with the use of said ink will be described below.

In the preparation of an ink of this invention, polymerizable unsaturated compounds represented by the general formulas (1) and (2) (component A), an epoxy group-containing compound (component B), polymerizable monomers or oligomers added as needed, a pigment (component D), a dispersing agent and a solvent used as needed are mixed together first with stirring, a photopolymerization initiator, a sensitizer or a radical polymerization initiator (component C) is added, and the resulting mixture is stirred to yield the desired alkali-developable photosensitive or thermosetting ink for color filter use.

In the preparation of a color filter with the use of an ink of this invention, one of red, blue and green inks is applied to the whole surface of the substrate of a color filter with the use of a spinner or a roll coater and the ink is precured to evaporate off the solvent. The ink is placed in close contact with a photomask having a desired pattern, exposed to an ultrahigh-pressure mercury lamp, and the exposed region is developed with an alkaline developer solution such as 1% aqueous solution of sodium carbonate and further washed with water. The film is postcured at a suitable temperature, for example, at 200° C., and dried completely to form the first pixel of the color filter. An ink containing a pigment corresponding to one of the remaining two colors is applied in the same manner as above to form the second pixel adjacent to the first pixel. An ink containing a pigment corresponding to the remaining color is similarly applied to form the third pixel of the color filter. Thus, pixels of three primary colors are obtained. A black matrix is provided in addition to the red, blue, and green pixels thus prepared and a layer of a transparent electrode which is composed, for example, of ITO (indium-tin oxide) is provided on the surface to yield a color filter with excellent heat resistance, transparency, adhesion characteristics, hardness, solvent resistance and alkali resistance.

This invention makes it possible to prepare an alkali-developable photosensitive or thermosetting resin composition suitable for the formation of protective films on color filters or solder resists in the preparation of printed circuit boards by mixing the aforementioned components A, B and C. The proportion of each component in such a resin composition is 100 parts by weight of the component A, 5 to 50 parts by weight of the component B and 0.1 to 30 parts by weight of the component C. It is preferable to use 10 to 30 parts by weight of the component B and 1 to 20 parts by weight of the component C per 100 parts by weight of the component A. With the use of less than 5 parts by weight of the component B per 100 parts by weight of the component A, a resin composition of this invention develops insufficient properties after curing, insufficient alkali resistance in particular. With more than 100 parts by weight of the component B, cracking occurs during curing and the adhesion characteristics tend to deteriorate. With less than 0.1 part by weight of the component C per 100 parts by weight of the component A, the rate of photopolymerization drops with a resultant drop of the sensitivity. On the other hand, with the use of the component C in excess of 30 parts by weight, it is difficult for light to reach the substrate and the adhesion between substrate and resin becomes poorer.

A resin composition of this invention is advantageously used as protective films on color filters for color liquid crystal displays. Moreover, it is possible to sputter ITO on the protective films at as high a temperature as 250° C. (the maximum temperature for this treatment has been 200° C. because of poorer heat resistance of the conventional protective films) and the protective films can withstand a treatment with strong acids and alkalis during patterning of ITO.

A developer solution suitable for the alkaline development of this resin composition is, for example, an aqueous solution of an alkali metal carbonate or alkaline earth metal carbonate and an aqueous solution of an alkali metal hydroxide. In particular, it is possible to develop fine images with precision by a weakly alkaline aqueous solution consisting of 1 to 3% by weight of a carbonate such as sodium carbonate, potassium carbonate and lithium carbonate. The alkaline development can be carried out at 10° to 50° C., preferably at 20° to 40° C., with the use of a commercial developing machine or an ultrasonic cleaner.

A resin composition of this invention cures by light or heat. Light suitable for this curing is the one discharged from an ultrahigh-pressure mercury lamp, a high-pressure mercury lamp or a metal halide lamp while heating for this curing is conducted normally at 80° to 250° C., preferably at 120° to 220° C., with the use of a heating oven.

An alkali-developable photosensitive or thermosetting resin composition of this invention can be used not only as protective films on color filters in color liquid crystal displays as mentioned above, but also as solder resists for printed circuit boards. In the latter case, the resin composition as solution is first applied to the surface of a printed circuit board or the resin composition as dry film is pasted on the surface of a printed circuit board to form a film, the resulting film is covered with a negative film and exposed to an active ray of light to cure the exposed region and the unexposed region is dissolved off by a weakly alkaline aqueous solution.

After the alkaline development, it is desirable to apply heat to effect epoxy curing in order to improve the alkali resistance. A resin composition of this invention improves not only in durability to strongly alkaline solutions to a remarkable degree but also in a variety of properties required for solder resists such as adhesion characteristics to glass and copper, heat resistance and surface hardness as a result of the heat treatment. The curing treatment is carried out, for example, at 80° to 200° C. for 10 to 120 minutes.

A solvent suitable for the preparation of a solution of a resin composition of this invention is, for example, a ketone such as methyl ethyl ketone and methyl isobutyl ketone and a cellosolve such as methyl cellosolve, ethyl cellosolve, butyl cellosolve and cellosolve acetate.

A process such as dipping, spraying, roll coating and spin coating may be adopted for the application of this solution to a substrate. The resin solution is applied to a thickness of 1 to 30 microns and the solvent is stripped off to form a film.

Depending upon the properties required for intended usages, it is allowable to add, besides the component A, the aforementioned photopolymerizable monomers and oligomers which act as viscosity modifier or photocrosslinking agent to an alkali-developable photosensitive or thermosetting resin composition of this invention. The amount of such additives is chosen from a range which does not affect adversely the properties of a resin composition of this invention. Normally, at least one of the aforementioned monomers and oligomers is added in an amount of 50 parts by weight or less per 100 parts by weight of the polymerizable unsaturated compounds of the general formulas (1) and (2). The use of more than 50 parts by weight of the monomers or oligomers causes a problem in tack after precure.

It is possible, as in the case of the aforementioned material for color filter use, to incorporate into a resin composition of this invention additives such as accelerators for epoxy groups, thermal polymerization inhibitors, plasticizers, leveling agents and antifoaming agents as needed.

The preparation of a film by the photopolymerization of an alkali-developable photosensitive resin of this invention and its composition will be described with reference to an example.

A photosensitive resin composition of this invention is diluted with a solvent and mixed suitably with additives such as photoinitiator, photoinitiation aid, coupling agent and antioxidant to prepare a resist solution. The resist solution is applied to a substrate by a process of free choice. Spin coating is used in the example, but dip coating and bar coating are also applicable. After coating of the resist solution, the solvent is evaporated by precure, the film is subjected to close-contact exposure to an ultrahigh-pressure mercury lamp, developed with a 1% aqueous solution of sodium carbonate and washed with water. The film is then postcured at 200° C. and dried completely with excellent heat resistance, transparency, adhesion characteristics, hardness, solvent resistance and alkali resistance.

The preparation of a film by the thermal polymerization of a thermosetting resin of this invention and its composition will be described with reference to an example.

A thermosetting resin composition of this invention is diluted with a solvent and mixed suitably with additives such as thermal polymerization initiator, coupling agent and antioxidant to prepare a resist solution. The resist solution is applied to a substrate by a process of free choice. Spin coating is used in the example, but dip coating and bar coating are also applicable. In the case of a film with a thickness of 2 μm, the resist solution is applied and precured to evaporate off the solvent. The film is then postcured and dried completely with excellent heat resistance, transparency, adhesion characteristics, hardness, solvent resistance and alkali resistance.

Figure 1:
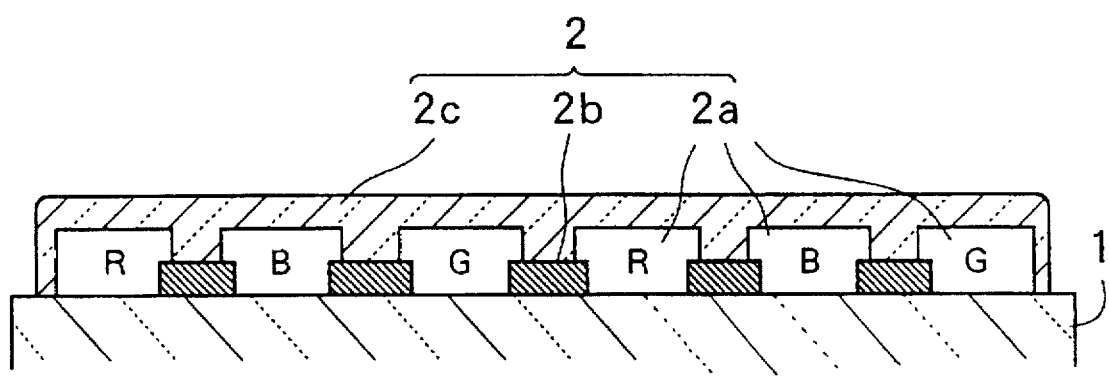
FIG. 1 is a diagram of pixels in a color filer.

| Legend: | |
|---|---|
| 1 | Glass substrate |
| 2 | Color filter |
| 2a | Pixel |
| 2b | Black matrix |
| R | Red pixel |
| G | Green pixel |
| B | Blue pixel |
| 2c | Transparent electrode layer |

DETAILED DESCRIPTION OF THE PREFERRED EMBODIMENTS

This invention will be described in detail below with reference to the accompanying examples and comparative examples. In these examples, "parts" means "parts by weight."

SYNTHETIC EXAMPLE 1

Into a 500-ml four-necked flask were introduced 231 g of bisphenolfluorene-based epoxy resin (epoxy equivalent 231), 450 mg of triethylbenzylammonium chloride, 100 mg of 2,6-di-isobutylphenol and 72.0 g of acrylic acid and the mixture was dissolved at 90° to 100° C. with air blown in at a rate of 25 ml per minute. The solution was heated up gradually while cloudy and heated at 120° C. until complete dissolution occurred. The solution gradually turned transparent and viscous and was stirred continuously as it was. The acid value was determined at intervals and the heating with stirring was continued until the acid value became less than 2.0 mg KOH/g. It required 8 hours for the acid value to reach the target of 0.8. Thereafter, the mixture was cooled to room temperature to yield a colorless transparent solid of bisphenolfluorene-based epoxy acrylate represented by the general formula (6).

The epoxy acrylate (303 g) thus obtained was dissolved in 2 kg of cellosolve acetate, the resulting solution was mixed with 38 g of 1,2,3, 6-tetrahydrophthalic anhydride, 73.5 g of biphenyltetracarboxylic acid dianhydride and 1 g of tetraethylammonium bromide, the mixture was gradually heated, and the reaction was allowed to proceed at 110° to 115° C. for 2 hours to yield polymerizable unsaturated compound (1̂) of the general formula (3) (m/n=5/5). The reaction with the acid anhydrides was confirmed by infrared spectroscopy. The compound obtained showed an inherent viscosity of 0.2 dl/g ($\eta_{inh}$=0.2).

EXAMPLE 1

The polymerizable unsaturated compound (m/n=5/5) thus obtained was used as component A and it was mixed with the following component B, component C, an organic solvent, and others in the proportion shown below to yield a photosensitive resin composition (resin composition 1̂).

| Components | Proportion (wt part) |
|---|---|
| Polymerizable unsaturated compound (1̂) (m/n = 5/5) | 20.0 |
| Dipentaerythritol hexaacrylate | 8.6 |
| Tetramethylbiphenyl-based epoxy resin | 4.4 |
| Michler's ketone | 0.2 |
| Irgacure 907 | 1.2 |
| Ethyl cellosolve acetate | 65.6 |
| Total | 100 |

Four pigments manufactured by Mikuni Color Ltd., CF Color Red EX-274, CF Color Green EX-276, CF Color Blue EX-275 and CF Color Black EX-277, were respectively used as red, green, blue and black pigment. Each of these pigments was dispersed in an organic solvent in advance, mixed with the aforementioned resin composition 1̂, and dispersed to prepare red, green, blue and black inks of the composition shown in Table 1 for color filter use. The dispersing treatment was carried out until the particle diameter of each pigment became 0.3 μm.

TABLE 1

| Kind of ink | Composition of ink (part by weight) | | |
|---|---|---|---|
| | Resin (1̂) | Pigment | Solvent |
| Red | 15 | 8 | 77 |
| Green | 15 | 8 | 77 |
| Blue | 17 | 6 | 77 |
| Black | 15 | 10 | 75 |

A glass plate washed with a neutral detergent, water, isopropyl alcohol and flon was used as transparent substrate.

A color filter was prepared by applying the aforementioned four kinds of ink, red, green, blue and black, to the glass substrate under the conditions of coating and light exposure shown in Table 2. Prebaking was effected at 80° C. for 5 minutes and development was carried out with the use of a 0.4% aqueous solution of sodium carbonate. As for the order of application of the inks, the black matrix was formed first followed by the successive formation of red (R), green (G) and blue (B) pixels at the specified positions. The thickness of film was set at 2±0.1 μm for each of the R, G, and B pixels and the black matrix. Furthermore, a tranparent electrode layer of ITO was formed by sputtering on the black matrix and the pixels.

As shown in FIG. 1, the procedure described above yields a color filter 2 constructed of a glass substrate 1, a black matrix 2b laminated to the glass substrate, a pixel 2a consisting of red pixel R, green pixel G and blue pixel B provided at specified positions of the black matrix and an overlying transparent electrode layer 2c. In the cases where a protective film for color filter use of this invention is required, it is provided above the black matrix 2b and the pixel 2a and below the transparent electrode layer 2c.

TABLE 2

| | Spin speed · time (rpm · 10 seconds) | Dose (mj/cm$^2$) |
|---|---|---|
| Red | 800 | 100 |
| Green | 800 | 100 |
| Blue | 800 | 100 |
| Black | 800 | 400 |

COMPARATIVE EXAMPLE 1

Dyeing was carried out with the use of a mixture of 6 parts by weight of poly(vinyl alcohol) (EG-30 manufactured by the Nippon Synthetic Chemical Industry Co., Ltd.), 0.5 part by weight of ammonium dichromate, 0.3 part by weight of chrome alum and 93.2 parts by weight of water as a photosensitive dyeing base and Red 24P, Green 1P, or Blue 5C as dye under the conditions shown in Table 3. Prebaking was effected at 60° C. for 10 minutes and the dyes were applied in the order of R, G and B with the thickness of each of the R, G and B pixels controlled at 1.5 ±0.2 μm.

TABLE 3

| | Spin speed · time (rpm · 10 seconds) | Dose (mj/cm$^2$) | Dyeing condition | |
|---|---|---|---|---|
| | | | Temp. °C. | pH |
| Red | 500 | 100 | 60 | 4.0 |
| Green | 500 | 100 | 60 | 4.5 |
| Blue | 500 | 100 | 60 | 5.5 |

The color filters thus prepared in Example 1 and Comparative Example 1 were tested for their light resistance with the aid of a xenon arc fadeometer. The values of ΔE (color difference) according to $L_{ab}$ after 1,000 hours are shown in Table 4.

As is apparent from the results in Table 4, the color filter of Example 1 shows a distinctly smaller ΔE and greater reliability in light resistance.

TABLE 4

|  | Red | Green | Blue |
|---|---|---|---|
| Example 1 | 1.5 | 1.2 | 1 |
| Comparative Example 1 | 5.5 | 7 | 4.8 |

COMPARATIVE EXAMPLE 2

A color filter was prepared as in Example 1 using Color Resist Inks (R, G, B; Fuji Hunt Co., Ltd.). Prebaking was effected at 90° C. for 5 minutes and the specified developer solution was used in development. The thickness of the prepared pixel was 2±0.1 µm for R, G and B.

The color filters of Example 1 and Comparative Example 2 were tested for their heat resistance (at 280° C. for 1 hour) and the reductions in the peak value of spectral transmittance and in the film thickness are shown in Table 5.

As is apparent from the results in Table 5, the product of this invention is superior to the conventional products in light and heat resistance.

TABLE 5

|  | Red | Green | Blue |
|---|---|---|---|
| Reduction in peak value of spectral transmittance (%) | | | |
| Example 1 | 3.0 | 2.7 | 3.5 |
| Comparative Example 2 | 4.5 | 5.5 | 7.6 |
| Reduction in film thickness (%) | | | |
| Example 1 | 7.1 | 8.8 | 6.4 |
| Comparative Example 2 | 7.2 | 25.0 | 20.0 |

SYNTHETIC EXAMPLE 2

The bisphenolfluorene-based epoxy acrylate of the general formula (6) (303 g) obtained in Synthetic Example 1 described above was dissolved in 2 kg of cellosolve acetate, mixed with 38 g of 1,2,3,6-tetrahydrophthalic anhydride, 80.5 g of benzophenonetetracarboxylic acid dianhydride and 1 g of tetraethylammonium bromide, heated up gradually, and allowed to react at 110° to 115° C. for 2 hours to yield compound 2 of the general formula (3) (m/n=5/5).

The reaction with the acid anhydrides was confirmed by infrared spectroscopy. The compound 2 obtained showed an inherent viscosity of 0.3 dl/g ($\eta_{inh}$=0.3).

SYNTHETIC EXAMPLE 3

The bisphenolfluorene-based epoxy acrylate of the general formula (6) (303 g) prepared in Synthetic Example 2 was dissolved in 2 kg of cellosolve acetate, mixed with 121.6 g of 1,2,3,6-tetrahydrophthalic anhydride, 64.6 g of benzophenonetetracarboxylic acid dianhydride and 1 g of tetraethylammonium bromide, heated up gradually, and allowed to react at 110° to 115° C. for 2 hours to yield compound 3 of the general formula (3) (m/n=8/2).

Figure 2:
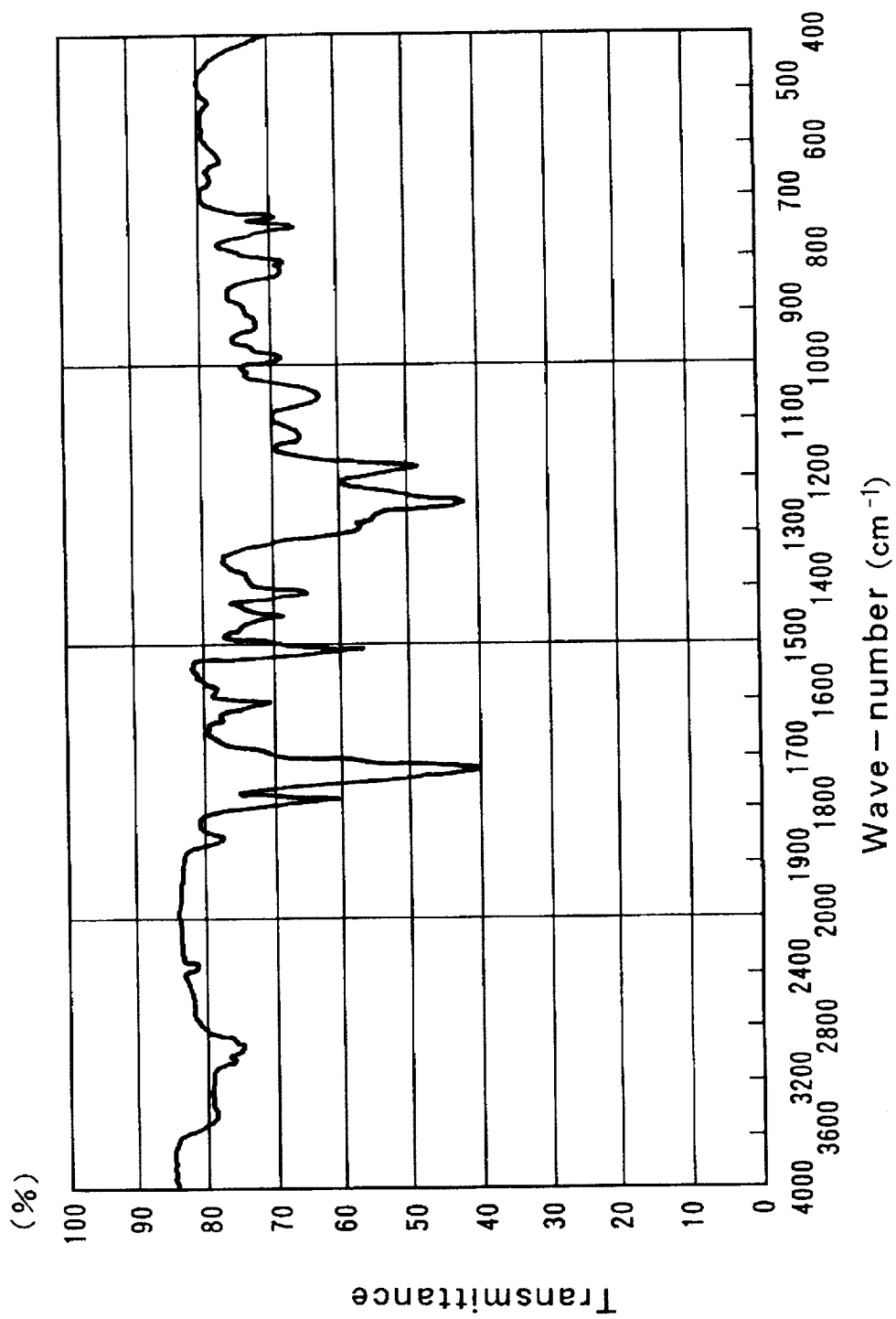
FIG. 2 is an infrared spectrum of the mixture before the reaction in Synthetic Example 3.
Figure 3:
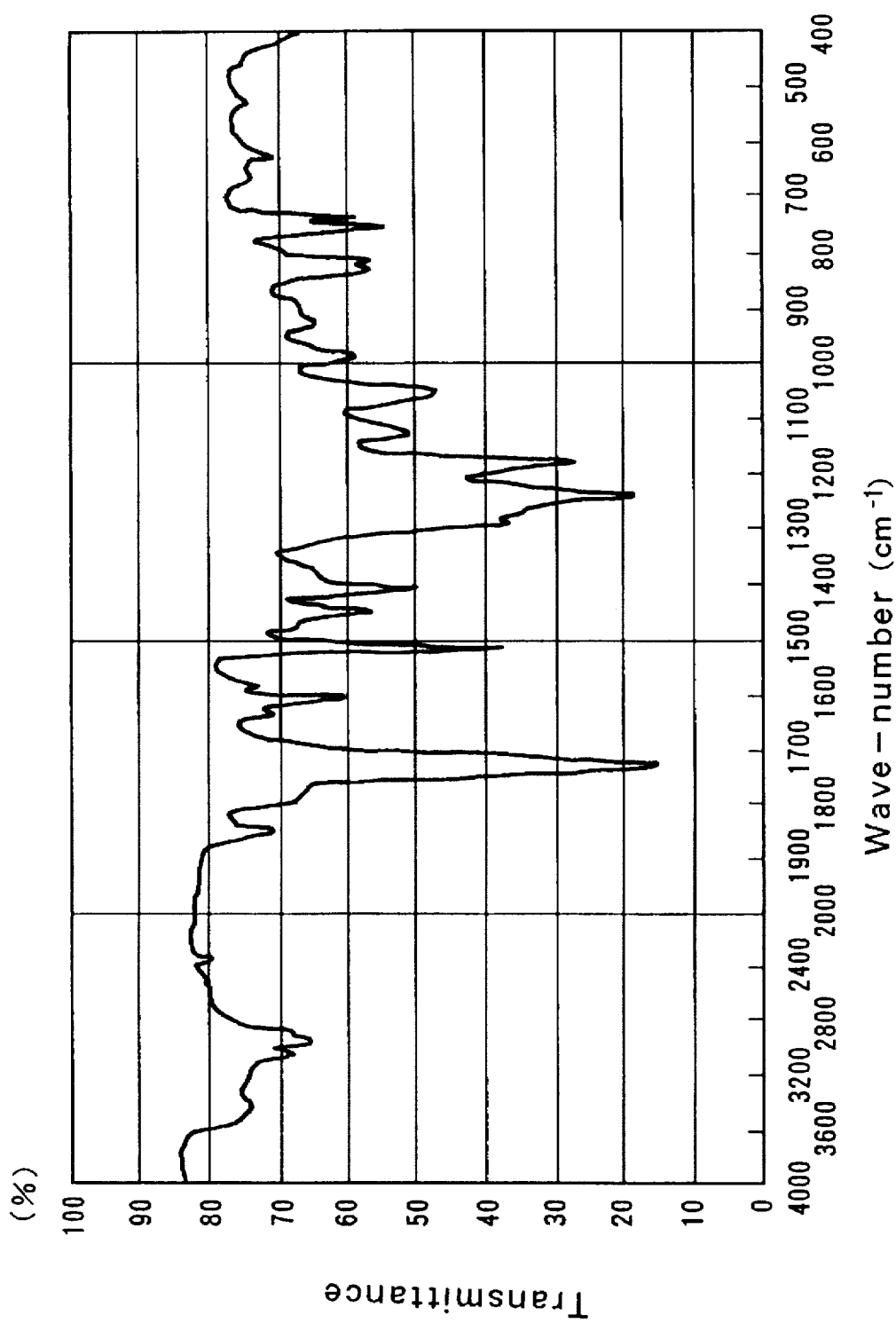
FIG. 3 is an infrared spectrum of the mixture after the reaction in Synthetic Example 3.

The reaction with the acid anhydrides was confirmed by infrared spectroscopy as in Synthetic Example 2. The compound 3 obtained showed an inherent viscosity of 0.2 dl/g ($\eta_{inh}$=0.2). The infrared spectra before and after the reaction are shown in FIG. 2 (before the reaction) and FIG. 3 (after the reaction).

SYNTHETIC EXAMPLE 4

The bisphenolfluorene-based epoxy acrylate of the general formula (6) (303 g) prepared in Synthetic Example 2 was dissolved in 2 kg of cellosolve acetate, mixed with 3.8 g of 1,2,3,6-tetrahydrophthalic anhydride, 153.8 g of benzophenonetetracarboxylic acid dianhydride and 1 g of tetraethylammonium bromide, heated up gradually, and allowed to react at 110° to 115° C. for 2 hours to yield compound 4 of the general formula (3) (m/n=0.5/95.5).

The reaction with the acid anhydrides was confirmed by infrared spectroscopy. The compound 4 obtained showed an inherent viscosity of 0.3 dl/g ($\eta_{inh}$=0.3).

SYNTHETIC EXAMPLE 5

The bisphenolfluorene-based epoxy acrylate of the general formula (6) (303 g) prepared in Synthetic Example 2 was dissolved in 2 kg of cellosolve acetate, mixed with 72.2 g of 1,2,3,6-tetrahydrophthalice, anhydride, 8.05 g of benzophenonetetracarboxylic acid dianhydride and 1 g of tetraethylammonium bromide, heated up gradually, and allowed to react at 110° to 115° C. for 2 hours to yield compound 5 of the general formula (3) (m/n=95/5).

The reaction with the acid anhydrides was confirmed by infrared spectroscopy. The compound 5 obtained showed an inherent viscosity of 0.2 dl/g ($\eta_{inh}$=0.2).

SYNTHETIC EXAMPLE 6

The reaction was carried out as in Synthetic Example 2 except using 153 g of biphenyl-based epoxy resin (epoxy equivalent 153) in place of the bisphenolfluorene-based epoxy resin of Synthetic Example 2 to yield compound 6 of the general formula (3) (m/n=5/5).

The reaction with the acid anhydrides was confirmed by infrared spectroscopy. The compound 6 obtained showed an inherent viscosity of 0.2 dl/g ($\eta$=0.2).

SYNTHETIC EXAMPLE 7

The reaction was carried out as in Synthetic Example 2 except using 163 g of benzophenone-based epoxy resin (epoxy equivalent 163) in place of the bisphenolfluorene-based epoxy resin of Synthetic Example 2 to yield compound 7 of the general formula (3) (m/n=5/5).

The reaction with the acid anhydrides was confirmed by infrared spectroscopy. The compound 7 obtained showed an inherent viscosity of 0.3 dl/g ($\eta_{inh}$=0.3).

SYNTHETIC EXAMPLE 8

The reaction was carried out as in Synthetic Example 2 except using 181 g of sulfone-based epoxy resin (epoxy equivalent 181) in place of the bisphenolfluorene-based epoxy resin of Synthetic Example 2 to yield compound 8 of the general formula (3) (m/n=5/5).

The reaction with the acid anhydrides was confirmed by infrared spectroscopy. The compound 8 obtained showed an inherent viscosity of 0.3 dl/g ($\eta_{inh}$=0.3).

SYNTHETIC EXAMPLE 9

The reaction was carried out as in Synthetic Example 2 except using 122 g of hexafluoropropane-based epoxy resin (epoxy equivalent 221) in place of the bisphenolfluorene-based epoxy resin of Synthetic Example 2 to yield compound 9 of the general formula (3) (m/n=5/5).

The reaction with the acid anhydrides was confirmed by infrared spectroscopy. The compound 9 obtained showed an inherent viscosity of 0.4 dl/g ($\eta_{inh}$=0.4).

SYNTHETIC EXAMPLE 10

The reaction was carried out as in Synthetic Example 2 except using 163 g of dimethylsilane-based epoxy resin (epoxy equivalent 163) in place of the bisphenolfluorene-based epoxy resin of Synthetic Example 2 to yield compound 10 of the general formula (3) (m/n=5/5).

The reaction with the acid anhydrides was confirmed by infrared spectroscopy. The compound 10 obtained showed an inherent viscosity of 0.2 dl/g ($\eta_{inh}$=0.2).

SYNTHETIC EXAMPLE 11

The reaction was carried out as in Synthetic Example 2 except using 156 g of diphenylmethane-based epoxy resin (epoxy equivalent 156) in place of the bisphenolfluorene-based epoxy resin of Synthetic Example 2 to yield compound 11 of the general formula (3) (m/n=5/5).

The reaction with the acid anhydrides was confirmed by infrared spectroscopy. The compound 11 obtained showed an inherent viscosity of 0.4 dl/g ($\eta_{inh}$=0.4).

SYNTHETIC EXAMPLE 12

The reaction was carried out as in Synthetic Example 2 except using 170 g of diphenylpropane-based epoxy resin (epoxy equivalent 170) in place of the bisphenolfluorene-based epoxy resin of Synthetic Example 2 to yield compound 12 of the general formula (3) (m/n=5/5).

The reaction with the acid anhydrides was confirmed by infrared spectroscopy. The compound 12 obtained showed an inherent viscosity of 0.4 dl/g ($\eta_{inh}$=0.4).

SYNTHETIC EXAMPLE 13

The reaction was carried out as in Synthetic Example 2 except using 157 g of diphenyl ether-based epoxy resin (epoxy equivalent 157) in place of the bisphenolfluorene-based epoxy resin of Synthetic Example 2 to yield compound 13 of the general formula (3) (m/n=5/5).

The reaction with the acid anhydrides was confirmed by infrared spectroscopy. The compound 13 obtained showed an inherent viscosity of 0.3 dl/g ($\eta_{inh}$=0.3).

SYNTHETIC EXAMPLE 14

The bisphenolfluorene-based epoxy acrylate of the general formula (6) (303 g) prepared in Synthetic Example 2 was dissolved in 2 kg of cellosolve acetate, mixed with 161 g of benzophenonetetracarboxylic acid dianhydride and 1 g of tetraethylammonium bromide, heated up gradually, and allowed to react at 110° to 115° C. for 2 hours to yield compound 14 of the general formula (2) (m/n=0/100).

The reaction with the acid anhydride was confirmed by the disappearance of the peak at 1780 cm$^{-1}$ in the infrared spectrum. The compound 14 obtained showed an inherent viscosity of 0.4 dl/g ($\eta_{inh}$=0.4).

SYNTHETIC EXAMPLE 15

The bisphenolfluorene-based epoxy acrylate of the general formula (6) (303 g) prepared in Synthetic Example 2 was dissolved in 2 kg of cellosolve acetate, mixed with 161 g of biphenyltetracarboxylic acid dianhydride and 1 g of tetraethylammonium bromide, heated up gradually, and allowed to react at 110° to 115° C. for 2 hours to yield compound 15 of the general formula (2) (m/n=0/100).

The reaction with the acid anhydride was confirmed by the disappearance of the peak at 1780 cm$^{-1}$ in the infrared spectrum. The compound 15 obtained showed an inherent viscosity of 0.4 dl/g ($\eta_{inh}$=0.4).

EXAMPLES 2 to 21

Resist solutions for Examples 2 to 21 were prepared by mixing the component A obtained in the aforementioned Synthetic Examples 2 to 15, the component B, the component C, polymerizable acrylic monomers or oligomers, a photopolymerization initiator, sensitizer or radical polymerization initiator and an organic solvent in the following proportion.

| Example 2 (m/n = 5/5) | Proportion (wt part) |
|---|---|
| Compound 2 | 20 |
| Tetramethylbiphenyl-based epoxy resin | 3 |
| Michler's ketone | 0.1 |
| Irgacure 907 (Ciba-Geigy) | 0.6 |
| Cellosolve acetate | 76.3 |
| Total | 100 |

| Example 3 (m/n = 5/5) | Proportion (wt part) |
|---|---|
| Compound 2 | 20 |
| Dipentaerythritol hexaacrylate | 8.6 |
| Tetramethylbiphenyl-based epoxy resin | 4.4 |
| Michler's ketone | 0.2 |
| Irgacure 907 (Ciba-Geigy) | 1.2 |
| Cellosolve acetate | 65.6 |
| Total | 100 |

| Example 4 (m/n = 8/2) | Proportion (wt part) |
|---|---|
| Compound 3 | 20 |
| Tetramethylbiphenyl-based epoxy resin | 3 |
| Michler's ketone | 0.1 |
| Irgacure 907 (Ciba-Geigy) | 0.6 |
| Cellosolve acetate | 76.3 |
| Total | 100 |

| Example 5 (m/n = 8/2) | Proportion (wt part) |
|---|---|
| Compound 3 | 20 |
| Dipentaerythritol hexaacrylate | 8.6 |
| Tetramethylbiphenyl-based epoxy resin | 4.4 |
| Michler's ketone | 0.2 |
| Irgacure 907 (Ciba-Geigy) | 1.2 |
| Cellosolve acetate | 65.6 |
| Total | 100 |

| Example 6 (m/n = 5/5) | Proportion (wt part) |
|---|---|
| Compound 2 | 20 |
| Tetramethylbiphenyl-based epoxy resin | 3 |
| Michler's ketone | 0.1 |
| Irgacure 907 (Ciba-Geigy) | 0.6 |
| Cellosolve acetate | 76.3 |
| Total | 100 |

| Example 7 (m/n = 5/5) | Proportion (wt part) |
|---|---|
| Compound 2 | 20 |
| Dipentaerythritol hexaacrylate | 8.6 |
| Tetramethylbiphenyl-based epoxy resin | 4.4 |
| Michler's ketone | 0.2 |
| Irgacure 907 (Ciba-Geigy) | 1.2 |
| Cellosolve acetate | 65.6 |
| Total | 100 |

| Example 8 (m/n = 5/5) | Proportion (wt part) |
|---|---|
| Compound 6 | 20 |
| Tetramethylbiphenyl-based epoxy resin | 3 |
| Michler's ketone | 0.1 |
| Irgacure 907 (Ciba-Geigy) | 0.6 |
| Cellosolve acetate | 76.3 |
| Total | 100 |

| Example 9 (m/n = 5/5) | Proportion (wt part) |
|---|---|
| Compound 7 | 20 |
| Tetramethylbiphenyl-based epoxy resin | 3 |
| Michler's ketone | 0.1 |
| Irgacure 907 (Ciba-Geigy) | 0.6 |
| Cellosolve acetate | 76.3 |
| Total | 100 |

| Example 10 (m/n = 5/5) | Proportion (wt part) |
|---|---|
| Compound 8 | 20 |
| Tetramethylbiphenyl-based epoxy resin | 3 |
| Michler's ketone | 0.1 |
| Irgacure 907 (Ciba-Geigy) | 0.6 |
| Cellosolve acetate | 76.3 |
| Total | 100 |

| Example 11 (m/n = 5/5) | Proportion (wt part) |
|---|---|
| Compound 9 | 20 |
| Tetramethylbiphenyl-based epoxy resin | 3 |
| Michler's ketone | 0.1 |
| Irgacure 907 (Ciba-Geigy) | 0.6 |
| Cellosolve acetate | 76.3 |
| Total | 100 |

| Example 12 (m/n = 5/5) | Proportion (wt part) |
|---|---|
| Compound 10 | 20 |
| Tetramethylbiphenyl-based epoxy resin | 3 |
| Michler's ketone | 0.1 |
| Irgacure 907 (Ciba-Geigy) | 0.6 |
| Cellosolve acetate | 76.3 |
| Total | 100 |

| Example 13 (m/n = 5/5) | Proportion (wt part) |
|---|---|
| Compound 11 | 20 |
| Tetramethylbiphenyl-based epoxy resin | 3 |
| Michler's ketone | 0.1 |
| Irgacure 907 (Ciba-Geigy) | 0.6 |
| Cellosolve acetate | 76.3 |
| Total | 100 |

| Example 14 (m/n = 5/5) | Proportion (wt part) |
|---|---|
| Compound 12 | 20 |
| Tetramethylbiphenyl-based epoxy resin | 3 |
| Michler's ketone | 0.1 |
| Irgacure 907 (Ciba-Geigy) | 0.6 |
| Cellosolve acetate | 76.3 |
| Total | 100 |

| Example 15 (m/n = 5/5) | Proportion (wt part) |
|---|---|
| Compound 13 | 20 |
| Tetramethylbiphenyl-based epoxy resin | 3 |
| Michler's ketone | 0.1 |
| Irgacure 907 (Ciba-Geigy) | 0.6 |
| Cellosolve acetate | 76.3 |
| Total | 100 |

| Example 16 (m/n = 0.5/95.5) | Proportion (wt part) |
|---|---|
| Compound 4 | 20 |
| Tetramethylbiphenyl-based epoxy resin | 3 |
| Michler's ketone | 0.1 |
| Irgacure 907 (Ciba-Geigy) | 0.6 |
| Cellosolve acetate | 76.3 |
| Total | 100 |

| Example 17 (m/n = 95/5) | Proportion (wt part) |
|---|---|
| Compound 5 | 20 |
| Dipentaerythritol hexaacrylate | 8.6 |
| Tetramethylbiphenyl-based epoxy resin | 4.4 |
| Michler's ketone | 0.2 |
| Irgacure 907 (Ciba-Geigy) | 1.2 |
| Cellosolve acetate | 65.6 |
| Total | 100 |

| Example 18 (m/n = 5/5) | Proportion (wt part) |
|---|---|
| Compound 2 | 20 |
| Dipentaerythritol hexaacrylate | 12 |
| Tetramethylbiphenyl-based epoxy resin | 4.8 |
| Michler's ketone | 0.2 |
| Irgacure 907 (Ciba-Geigy) | 1.2 |
| Cellosolve acetate | 61.8 |
| Total | 100 |

| Example 19 (m/n = 5/5) | Proportion (wt part) |
|---|---|
| Compound 1 | 20 |
| Dipentaerythritol hexaacrylate | 8.6 |
| Tetramethylbiphenyl-based epoxy resin | 4.4 |
| Benzoyl peroxide | 1.4 |
| Cellosolve acetate | 65.6 |
| Total | 100 |

| Example 20 (m/n = 0/100) | Proportion (wt part) |
|---|---|
| Compound 14 | 20 |
| Dipentaerythritol hexaacrylate | 8.6 |
| Tetramethylbiphenyl-based epoxy resin | 4.4 |
| Benzoyl peroxide | 1.4 |
| Cellosolve acetate | 65.6 |
| Total | 100 |

| Example 21 (m/n = 0/100) | Proportion (wt part) |
|---|---|
| Compound 15 | 20 |
| Dipentaerythritol hexaacrylate | 8.6 |
| Tetramethylbiphenyl-based epoxy resin | 4.4 |
| Benzoyl peroxide | 1.4 |
| Cellosolve acetate | 65.6 |
| Total | 100 |

A degreased 1.2 mm-thick glass plate was coated with the resist solution obtained in any one of the aforementioned Examples 2 to 18 to a thickness of approximately 2 μm, dried, placed in close contact with a photomask, and irradiated with ultraviolet rays of a wavelength of 365 nm and an illuminance of 10 mw/cm$^2$ using a 500-W high-pressure mercury lamp. After the exposure, the film was developed with a 1% aqueous solution of sodium carbonate at 25° C. for 30 seconds to remove the unexposed region. Thereafter, the film was dried at 200° C. for 30 minutes in a hot-air dryer.

A degreased 1.2 mm-thick glass plate was also coated with the resist solution obtained in any one of the aforementioned Examples 19 to 21 to a thickness of approximately 2 μm, dried at 80° C. and further dried at 200° C. for 30 minutes in a hot-air dryer.

The specimens obtained in the aforementioned Examples 2 to 21 were evaluated for the drying characteristics of film, developing characteristics in aqueous alkaline solutions, sensitivity to exposure, hardness of film, adhesion characteristics to substrate, heat resistance and chemical resistance. The results are shown in Table 6.

The properties were determined as follows.
(1) Drying characteristics of film
The drying characteristics quality of the film were evaluated in accordance with JIS-K5400 and ranked as follows.
○: Tack is not observed at all.
Δ: Tack is observed slightly.
×: Tack is observed to a marked degree.
(2) Developing characteristics in aqueous alkaline solutions
Development was carried out by immersion in a 1% aqueous solution of sodium carbonate for 30 seconds. After development, the film was visually observed under 40-fold magnification for the condition of the residual resins and the results were ranked as follows.
○: Good developing quality (no resist remaining on the glass)
×: Poor developing quality (resist remaining slightly on the glass)
(3) Sensitivity to exposure
The film was placed in close contact with Kodak Step Tablet No. 2 (a negative film with 21 steps, each step differing from the next in optical density by 0.15, manufactured by Eastman Kodak Co.) and irradiated with ultraviolet rays of a light quantity of 200 mJ/cm$^2$ from a 500-W high-pressure mercury lamp. The number of steps remaining after the development of the film in a weakly alkaline aqueous solution was examined (the higher the sensitivity, the greater the number of the remaining steps becomes with this test method).
(4) Hardness of film
After exposure and development, the film was heated at 200° C. for 30 minutes and tested for its hardness according to JIS-K5400 with the aid of a pencil hardness tester under a load of 1 kg, the highest hardness producing no scratch on the film being recorded as test value. The pencil used was "Mitsubishi Hi-Uni."
(5) Adhesion characteristics to substrate
After exposure and development, the film was heated at 200° C. for 30 minutes, cross-cut to form at least 100 small squares, and subjected to a peeling test with the use of an adhesive tape. The condition of peeling of the squares was visually evaluated as follows.
○: No peeling
×: Slight peeling
(6) Heat resistance
After exposure and development, the film was heated at 200° C. for 30 minutes and then placed in an oven at 250° C. for 3 hours and the condition of the film was evaluated as follows.

○: No abnormality on the film surface
×: Cracking, peeling or discoloration on the film surface (7) Chemical resistance After exposure and development, the film was heated at 200° C. for 30 minutes and immersed in the chemicals under the conditions indicated below and evaluated for the appearance and adhesion characteristics.

Acid resistance: in 5% HCl for 24 hours

Alkali resistance: in 5% NaOH for 24 hours in 4% KOH at 50° C. for 10 minutes in 1% NaOH at 80° C. for 5 minutes Solvent resistance: in NMP at 40° C. for 10 minutes in NMP at 80° C. for 5 minutes (Note) NMP: N-methylpyrrolidone

TABLE 6

| Example No. | | 2 | 3 | 4 | 5 | 6 | 7 | 8 | 9 | 10 | 11 | 12 | 13 | 14 | 15 | 16 | 17 | 18 | 19 | 20 | 21 |
|---|---|---|---|---|---|---|---|---|---|---|---|---|---|---|---|---|---|---|---|---|---|
| Evaluation | A | ○ | ○ | ○ | ○ | ○ | ○ | ○ | ○ | ○ | ○ | ○ | ○ | ○ | ○ | ○ | × | ○ | ○ | ○ | ○ |
| Items | B | ○ | ○ | ○ | ○ | ○ | ○ | ○ | ○ | ○ | ○ | ○ | ○ | ○ | ○ | × | × | ○ | — | — | — |
| | C | 8 | 9 | 8 | 9 | 8 | 9 | 9 | 8 | 9 | 9 | 9 | 9 | 9 | 8 | 8 | 9 | 9 | — | — | — |
| | D | 4H | 5H | 4H | 5H | 4H | 5H | 5H | 5H | 5H | 4H | 4H | 5H | 5H | 5H | — | 5H | 5H | 5H | 5H | 5H |
| | E | ○ | ○ | ○ | ○ | ○ | ○ | ○ | ○ | ○ | ○ | ○ | ○ | ○ | ○ | — | ○ | ○ | ○ | ○ | ○ |
| | F | ○ | ○ | ○ | ○ | ○ | ○ | ○ | ○ | ○ | ○ | ○ | ○ | ○ | ○ | — | ○ | ○ | ○ | ○ | ○ |
| | G | ○ | ○ | ○ | ○ | ○ | ○ | ○ | ○ | ○ | ○ | ○ | ○ | ○ | ○ | — | ○ | ○ | ○ | ○ | ○ |

[Evaluation Items]
A: Drying characteristics of film
B: Developing characteristics
C: Sensitivity to exposure
D: Hardness of film
E: Adhesion characteristics
F: Heat resistance
G: Chemical resistance
(Note)
In Example 16, the dissolution of the film occurred during development and the adhesion characteristics, heat resistance and chemical resistance could not be evaluated.

As is apparent from the results in Table 6, the products in Examples 2 to 15 have attained the target properties. At m/n=0.5/95.5 as in Example 16, however, the quantity of carboxyl groups in the polymerizable unsaturated compounds is large and even the cured region dissolves in an aqueous alkaline solution during development, which makes it impossible to obtain a product of target properties. On the other hand, at m/n=95/5 as in Example 17, the quantity of the polymerizable unsaturated compounds is small, which accounts for poor developing characteristics in an aqueous alkaline solution. In Example 18 where an acrylic oligomer (dipentaerythritol hexaacrylate) was used in a larger quantity, tack remained on the film after precure and close-contact exposure was difficult to apply.

In Examples 19 to 21, the films were prepared from thermosetting resin compositions and they performed excellently in respect to drying characteristics of film, hardness of film, adhesion characteristics to substrate, heat resistance and chemical resistance.

The results mentioned above prove that alkali-developable photosensitive or thermosetting resin compositions of this invention can provide protective films with excellent heat resistance, transparency, adhesion characteristics, hardness, solvent resistance and alkali resistance.

Industrial Applicability

A material for color filter use of this invention undergoes photochemical and/or thermal crosslinking even in the presence of oxygen and is therefore easy to prepare in a simple process. A film of the material becomes tack-free after precure and this makes it possible to apply close-contact exposure to the film with resultant higher resolution. In addition, the film shows excellent performance in respect to heat resistance, transparency, acid resistance, alkali resistance, solvent resistance and surface hardness.

In the cases where a material for color filter use of this invention is ink, a color filter prepared from the ink shows excellent resistance to acid, alkali and solvent and surface hardness and is useful for a variety of multicolor displays such as color liquid crystal display devices, color facsimile and image sensors and displays such as video monitors and computers.

An alkali-developable photosensitive or thermosetting resin composition of this invention can attain such a high degree of heat resistance and transparency as was impossible to attain thus far by the conventional materials.

A resin composition of this invention forms a tack-free film after precure and this makes it possible to apply close-contact exposure to the film with the resultant higher resolution. Moreover, a photosensitive or thermosetting resin composition of this invention excels in acid resistance, alkali resistance, solvent resistance and surface hardness and is useful not only for permanent protective masks of solder resists and the like but also in a variety of applications such as etching resists and interlayer insulation materials in the fields relating to printed circuit boards, photosensitive adhesives, coatings, photosensitive liquids for screen printing and resist inks.

What is claimed is:

1. A material for color filter use or a protective film therefor which comprises (A) 100 parts by weight of photochemically and thermally polymerizable unsaturated compounds having 50% by weight or more of structural units represented by the following general formulas (1) and (2)

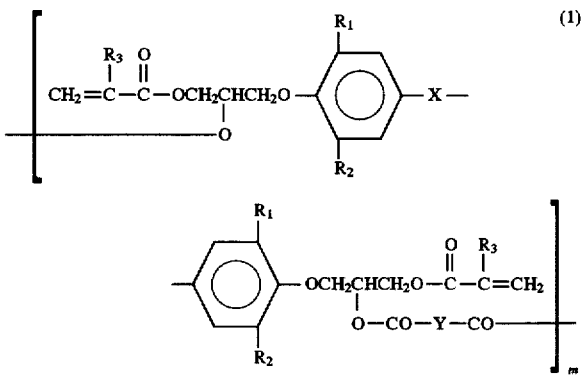

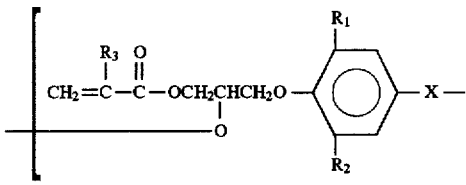

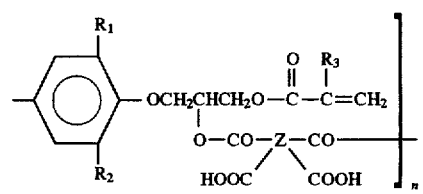

wherein $R_1$ and $R_2$ designate hydrogen, alkyl group with 1 to 5 carbon atoms or halogen, $R_3$ designates hydrogen or methyl group, X designates —CO—, —SO$_2$—, —C(CF$_3$)$_2$—, —Si(CH$_3$)$_2$—, —CH$_2$—, —C(CH$_3$)$_2$—, —O—,

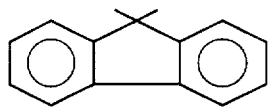

or a direct linkage, Y designates a divalent organic group of an acid anhydride, Z designates a tetravalent organic group of an acid dianhydride and the mole ratio of the structural units (m/n) is 1/99 to 90/10 and showing an inherent viscosity ($\eta_{inh}$) of 0.1 dl/g or more as determined on a solution of 0.5 g of said compounds in 100 ml of N-methylpyrrolidone at 30° C., (B) 5 to 50 parts by weight of a compound having an epoxy group, (C) 0.1 to 30 parts by weight of a photopolymerization initiator, a sensitizer or a radical polymerization initiator and (D) 0 to 200 parts by weight of a pigment.

2. A material for color filter use or a protective film therefor as described in claim 1 wherein the component A is polymerizable unsaturated compounds having 50% by weight or more of structural units represented by the following general formula (3)

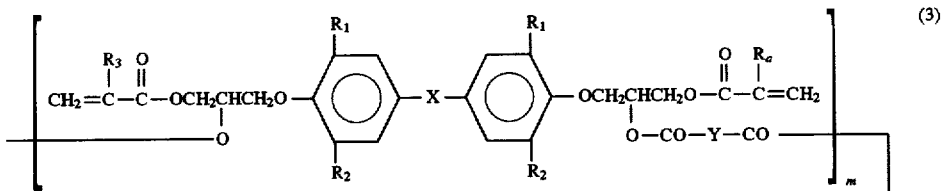

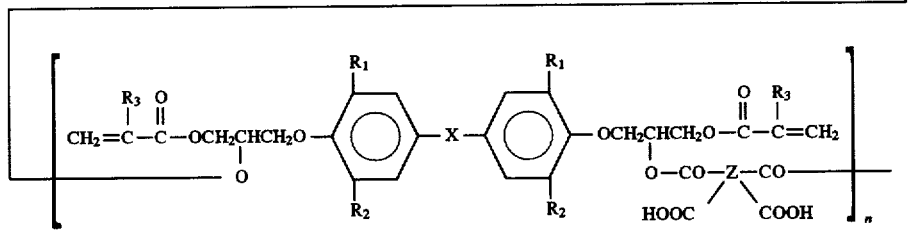

wherein $R_1$, $R_2$, X, Y and Z are as defined in claim 1 and the mole ratio of the structural units (m/n) is from 1/99 to 90/10.

3. A material for color filter use or a protective film therefor as described in claim 1 wherein polymerizable unsaturated compounds with X designating

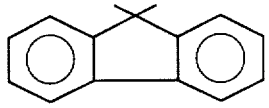

in the general formulas (1) and (2) are used as component A.

4. A material for color filter use or a protective film therefor as described in claim 1 wherein said material is an alkali-developable photosensitive material for color filter use.

5. A material for color filter use as described in claim 1 wherein the proportion of the component D ranges from 10 to 200 parts by weight.

6. A material for color filter use or a protective film therefor as described in claim 1 wherein at least one compound selected from the group consisting of polymerizable monomers and polymerizable oligomers is used in addition to the components A, B, C and D in a proportion of 50 parts by weight or more to 100 parts by weight of the component A.

7. A material for color filter use as described in claim 1 wherein said material is an alkali-developable ink for color filter use.

8. A material for color filter use or a protective film therefor as described in claim 1 wherein said material is a material for a protective film for color filter use.

9. A color filter which comprises a protective film obtained by applying a material for a protective film for color filter use described in claim 8 and curing said material.

10. A color filter which comprises a transparent substrate, red, blue and green pixels and a black matrix provided on said substrate by coating with alkali-developable inks for color filter use described in claim 7 and curing them and a transparent electrode layer provided on the surface of said pixels and black matrix.

11. A resin composition which comprises (A) 100 parts by weight of photochemically and thermally polymerizable unsaturated compounds having 50% by weight or more of structural units represented by the following general formulas (1) and (2)

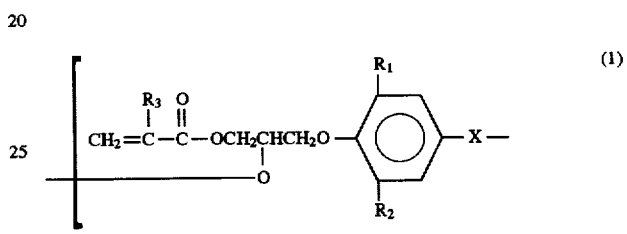

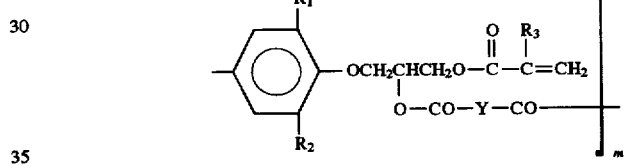

wherein $R_1$ and $R_2$ designate hydrogen, alkyl group with 1 to 5 carbon atoms or halogen, $R_3$ designates hydrogen or methyl group, X designates —CO—, —SO$_2$—, —C(CF$_3$)$_2$—, —Si(CH$_3$)$_2$—, —CH$_2$—, —C(CH$_3$)$_2$—, —O—,

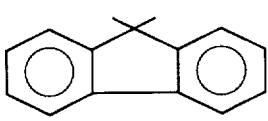

or a direct linkage, Y designates a divalent organic group of an acid anhydride, Z designates a tetravalent organic group of an acid dianhydride and the mole ratio of the structural units (m/n) is 1/99 to 90/10 and showing an inherent viscosity ($\eta_{inh}$) of 0.1 dl/g or more as determined on a solution of 0.5 g of said compounds in 100 ml of N-methylpyrrolidone at 30° C., (B) 5 to 50 parts by weight of a compound having an epoxy group and (C) 0.1 to 30 parts by weight of a photopolymerization initiator, a sensitizer or a radical polymerization initiator.

12. A resin composition as described in claim 11 wherein the component A is polymerizable unsaturated compounds having 50% by weight or more of structural units represented by the following general formula (3)

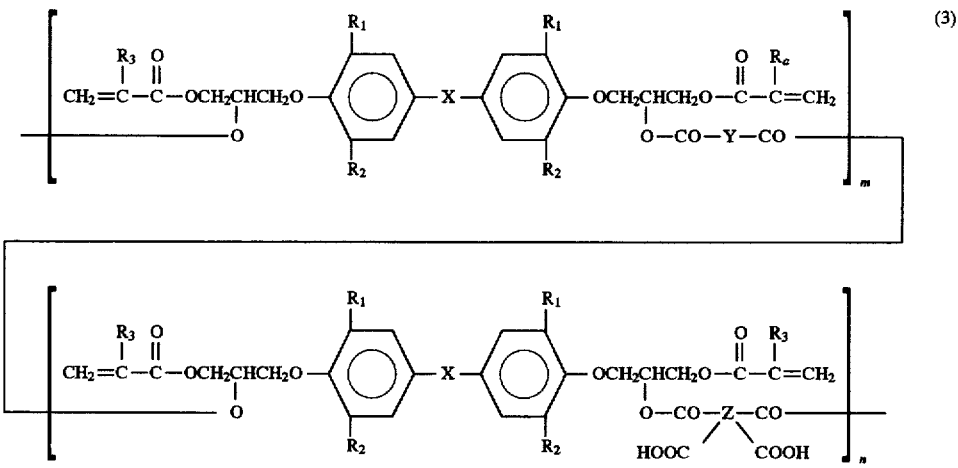

wherein $R_1$, $R_2$, X, Y and Z are as defined in claim 11 and the mole ratio of the structural units (m/n) is from 1/99 to 90/10.

13. A cured product obtained by curing a resin composition described in claim 11.

14. A resin composition as described in claim 11 wherein polymerizable unsaturated compounds with X designating

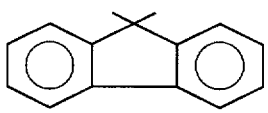

in the general formulas (1) and (2) are used as the component A.

15. A resin composition as described in claim 11 wherein at least one compound selected from the group consisting of polymerizable monomers and polymerizable oligomers is used in addition to the components A, B and C in a proportion of 50 parts by weight or more to 100 parts by weight of the component A.

16. Polymerizable unsaturated compounds which are characterized by having 50% by weight or more of structural units represented by the following general formulas (1) and (2)

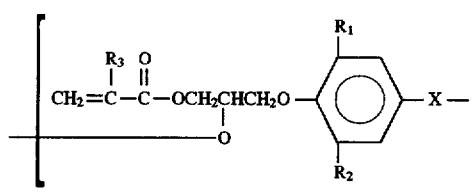

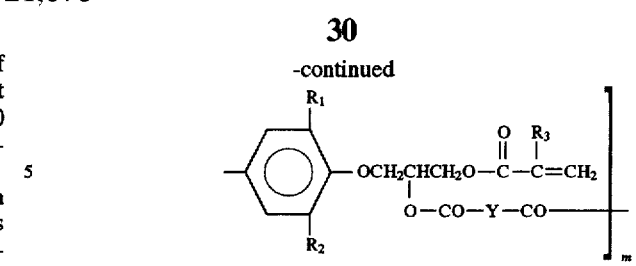

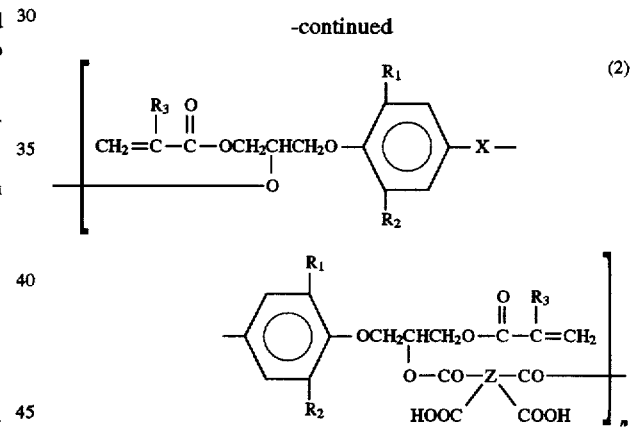

wherein $R_1$ and $R_2$ designate hydrogen, alkyl group with 1 to 5 carbon atoms or halogen, $R_3$ designates hydrogen or methyl group, X designates —CO—, —SO$_2$—, —C(CF$_3$)$_2$—, —Si(CH$_3$)$_2$—, —CH$_2$—, —C(CH$_3$)$_2$—, —O—,

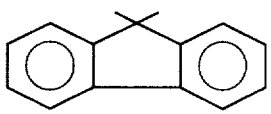

or a direct linkage, Y designates a divalent organic group of an acid anhydride, Z designates a tetravalent organic group of an acid dianhydride and the mole ratio of the structural units (m/n) is from 1/99 to 90/10 and showing an inherent viscosity ($\eta_{inh}$) of 0.1 dl/g or more as determined on a solution of 0.5 g of said compounds in 100 ml of N-methylpyrrolidone at 30° C.

17. Polymerizable unsaturated compounds as described in claim 16 wherein the structural units represented by the general formulas (1) and (2) are those represented by the following general formula (3)

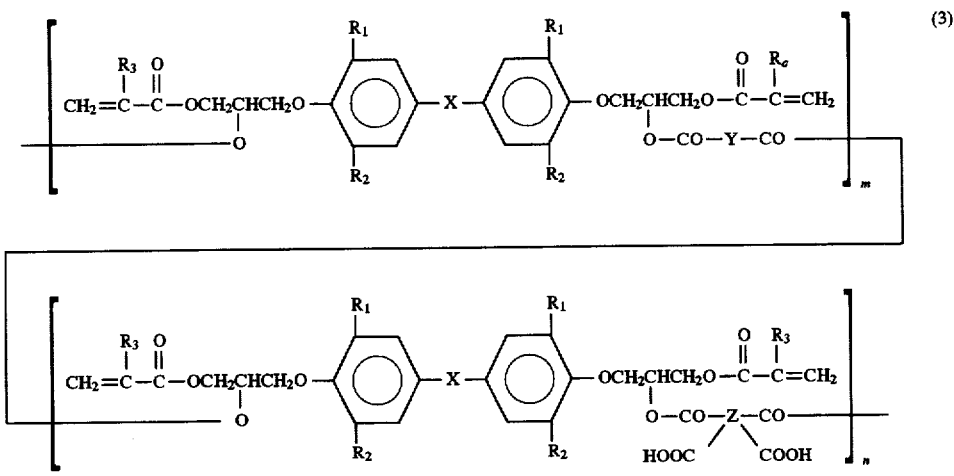

wherein $R_1$, $R_2$, X, Y and Z are as defined in claim 16 and the mole ratio of the structural units (m/n) is from 1/99 to 90/10.

18. A cured product obtained by curing polymerizable unsaturated compounds described in claim 16.

19. Polymerizable unsaturated compounds as described in 16 wherein the mole ratio (m/n) of the structural units represented by the general formulas (1) and (2) is 5/95 to 80/20.

20. Polymerizable unsaturated compounds as described in 16 wherein X in the general formulas (1) and (2) is

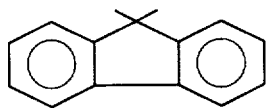

* * * * *